United States Patent
Chang et al.

(10) Patent No.: US 10,043,390 B2
(45) Date of Patent: Aug. 7, 2018

(54) PARKING SPACE SENSOR

(71) Applicant: GEMTEK TECHNOLOGY CO., LTD., Hsinchu (TW)

(72) Inventors: Yu-Chia Chang, Hsinchu (TW); Chung-Chih Liu, Hsinchu (TW)

(73) Assignee: Gemtek Technology Co., Ltd., Hsinchu (TW)

( * ) Notice: Subject to any disclaimer, the term of this patent is extended or adjusted under 35 U.S.C. 154(b) by 0 days.

(21) Appl. No.: 15/648,792

(22) Filed: Jul. 13, 2017

(65) Prior Publication Data
US 2018/0165961 A1     Jun. 14, 2018

Related U.S. Application Data
(60) Provisional application No. 62/432,049, filed on Dec. 9, 2016.

(51) Int. Cl.
| | |
|---|---|
| G08G 1/14 | (2006.01) |
| G06K 7/08 | (2006.01) |
| G08G 1/16 | (2006.01) |
| G06F 17/30 | (2006.01) |

(52) U.S. Cl.
CPC ......... *G08G 1/141* (2013.01); *G06F 17/3051* (2013.01); *G06K 7/082* (2013.01); *G08G 1/147* (2013.01); *G08G 1/168* (2013.01)

(58) Field of Classification Search
None
See application file for complete search history.

(56) References Cited

U.S. PATENT DOCUMENTS

| | | | | |
|---|---|---|---|---|
| 9,666,075 | B2* | 5/2017 | Davies | G08G 1/149 |
| 2001/0012745 | A1* | 8/2001 | Yoneda | A63H 17/44 446/423 |
| 2003/0007263 | A1* | 1/2003 | Morrison | B60R 1/007 359/860 |
| 2004/0204240 | A1* | 10/2004 | Barney | A63H 30/04 463/36 |
| 2005/0143173 | A1* | 6/2005 | Barney | A63F 13/06 463/37 |
| 2008/0068219 | A1* | 3/2008 | Dergounov | B60Q 1/484 340/932.2 |
| 2009/0128364 | A1* | 5/2009 | Lee | B60Q 9/004 340/932.2 |

(Continued)

FOREIGN PATENT DOCUMENTS

| | | |
|---|---|---|
| CN | 201274096 Y | 7/2009 |
| CN | 203276592 U | 11/2013 |

*Primary Examiner* — Fekadeselassie Girma
(74) *Attorney, Agent, or Firm* — Rosenberg, Klein & Lee

(57) ABSTRACT

The present invention provides a parking space sensor, which comprises a sensing module, a control unit, and a trigger module. The sensing module senses the status of a parking space and generates a sensing signal. When the parking space sensor, and hence the trigger module, is flipped over, the trigger module triggers the control unit to perform an initialization procedure, in which the control unit transmits an initialization signal to the sensing module for initializing the sensing module. Thereby, the status of the parking space can be sensed and a sensing signal can be generated. Then the control unit produces a piece of parking space information according to the sensing signal.

15 Claims, 6 Drawing Sheets

(56) References Cited

U.S. PATENT DOCUMENTS

| | | | |
|---|---|---|---|
| 2009/0203306 A1* | 8/2009 | Sugata | B60S 5/00 454/234 |
| 2010/0026521 A1* | 2/2010 | Noel, II | G08G 1/042 340/932.2 |
| 2010/0057355 A1* | 3/2010 | Fein | G01S 5/00 701/533 |
| 2010/0235053 A1* | 9/2010 | Iwakiri | B62D 15/027 701/42 |
| 2010/0295826 A1* | 11/2010 | Yeh | G06F 3/03545 345/179 |
| 2011/0063133 A1* | 3/2011 | Keller | G07B 15/02 340/932.2 |
| 2014/0132758 A1* | 5/2014 | Saptharishi | H04N 7/18 348/135 |
| 2014/0156148 A1* | 6/2014 | Kikuchi | B62D 15/027 701/48 |
| 2015/0138001 A1* | 5/2015 | Davies | G08G 1/149 340/932.2 |
| 2016/0366919 A1* | 12/2016 | van Someren Greve | A23L 3/34095 |
| 2017/0108958 A1* | 4/2017 | Yeh | G06F 3/03546 |
| 2017/0113134 A1* | 4/2017 | Barney | A63F 13/245 |
| 2017/0148230 A1* | 5/2017 | Richard | G07B 15/02 |
| 2017/0267233 A1* | 9/2017 | Minster | B60W 30/06 |
| 2017/0325082 A1* | 11/2017 | Rowe | H04W 4/18 |
| 2017/0345304 A1* | 11/2017 | Oesterling | G08G 1/149 |
| 2017/0345305 A1* | 11/2017 | Zheng | G08G 1/149 |

* cited by examiner

PARKING SPACE SENSOR

REFERENCE TO RELATED APPLICATION

This Application is based on Provisional Patent Application Ser. No. 62/432,049, filed 9 Dec. 2016.

FIELD OF THE INVENTION

The present invention relates generally to a sensor, and particularly to a parking space sensor.

BACKGROUND OF THE INVENTION

Owing to the modernization and expansion of worldwide cities, the quantities of population and cars in cities increase and the demands for parking spaces rise gradually. To meet such demands, flat parking lots, parking towers, or on-street parking grids are built in most cities. Although this method satisfies the needs for parking spaces, due to the widespread parking lots or grids over a city, drivers always need to search for a void parking space aimlessly while parking. This is extremely inconvenient for them.

Accordingly, it is highly desired to have a novel parking space sensor for improving the drivers' convenience in finding void parking spaces and thus shortening the time required to find one.

SUMMARY

An objective of the present invention is to provide a parking space sensor, which comprises a sensing module for sensing the state of a parking space and producing parking-space information. The parking-space information can be provided to drivers for improving the drivers' convenience in finding void parking spaces and thus shortening the time required to find one Another objective of the present invention is to provide a parking space sensor. Engineering staffs can trigger the parking space sensor to initialize by flipping the parking space sensor over. Then the sensing module can be initialized to sense the state of a parking space.

In order to achieve the above objectives and efficacies, an embodiment of the present invention discloses a parking space sensor, which comprises a sensing module, a control unit, and a trigger module. The sensing module senses the state of a parking space and generates a sensing signal. The control unit is coupled to the sensing module. The control unit performs an initialization procedure by transmitting an initialization signal to the sensing module and thus initializing the sensing module to sense the state of the parking space. It also receives the sensing signal and produces parking-space information according to the sensing signal. The trigger module is coupled to the control unit. When the trigger module is flipped over, it triggers the control unit to perform the initialization procedure.

According to an embodiment of the present invention, when the control unit is triggered by the trigger module to perform the initialization procedure, the control unit counts the time. When the control unit counts the time to a waiting time, it transmits the initialization signal to the sensing module.

According to an embodiment of the present invention, the parking space sensor further comprises a communication module, which transmits a waiting message. The waiting message includes a piece of identification information. When the control unit is triggered by the trigger module to perform the initialization procedure, the control unit counts the time. Before the control unit counts the time to a waiting time, the control unit controls the communication module to transmit the waiting message. A terminal device receives the waiting message and identifies the parking space sensor according to the identification information of the waiting message. The terminal device also transmits an initialization command. The communication module receives the initialization command and transmits the initialization command to the control unit. The control unit transmits the initialization signal to the sensing module according to the initialization command.

According to an embodiment of the present invention, the terminal device includes an image capturing unit, which captures an electronic barcode disposed on the parking space sensor for acquiring the identification information of the parking space sensor.

According to an embodiment of the present invention, the parking space sensor further comprises a first near-field communication unit. The terminal device includes a second near-field communication unit. The second near-field communication unit communicates with the first near-field communication unit for acquiring the identification information of the parking space sensor.

According to an embodiment of the present invention, the sensing signal includes a first magnetic-field sensing signal and a second magnetic-field sensing signal. When the sensing module receives the initialization signal, the sensing module senses the magnetic field of the parking space, and generates and stores a first magnetic-field sensing signal. The sensing module continues to sense the magnetic field of the parking space and generates a second magnetic-field sensing signal. The control unit updates the sparking space information according to a difference value between the first and second magnetic-field sensing signals and transmits the updated parking space information to a server. The updated parking space information includes a piece of identification information and a piece of status information. The server acquires a piece of location information of the parking space sensor according to the identification information.

According to an embodiment of the present invention, the sensing module includes a sensing unit and a processing unit. The sensing unit senses the magnetic field of the parking space. The processing unit compares the first magnetic-field sensing signal with the second magnetic-field sensing signal for giving the difference value. It also compares the difference value with a threshold value for giving a comparison result and hence judging the status of the parking space. The processing unit then transmits a status signal to the control unit. The control unit updates the status information of the parking space information according to the status signal.

According to an embodiment of the present invention, when the difference value is greater than the threshold value and maintains for a sustained time, the processing unit produces the comparison result, judges a car parking in the parking space, and transmits the status signal to the control unit.

According to an embodiment of the present invention, the control unit compares the first magnetic-field sensing signal with the second magnetic-field sensing signal for giving the difference value. It also compares the difference value with a threshold value for giving a comparison result and hence updating the status information of the parking space information according to the comparison result.

According to an embodiment of the present invention, when the difference value is greater than the threshold value and maintains for a sustained time, the control unit produces the comparison result, judges a car parking in the parking space, and updates the status information of the parking space information.

According to an embodiment of the present invention, a terminal device transmits a piece of configuration information to the parking space sensor for configuring the sustained time.

According to an embodiment of the present invention, the parking space sensor further comprises a power supply unit. The trigger module includes a ball switch coupled between the power supply unit and the control unit. When the trigger module is flipped over and the ball switch is turned on, the power supply unit supplies power to the control unit through the ball switch and hence triggering the control unit to perform the initialization procedure.

According to an embodiment of the present invention, the trigger module includes a movement sensor, which senses the movement status of the parking space sensor. When the parking space sensor is flipped over, the control unit is triggered to perform the initialization procedure.

According to an embodiment of the present invention, the trigger module further includes a processing unit coupled to the movement sensor and the control unit. The movement sensor senses the moving status of the parking space sensor and generates a movement sensing signal. When the processing unit judges that the parking space sensor is flipped over according to the movement sensing signal, the processing unit triggers the control unit to perform the initialization procedure.

According to an embodiment of the present invention, the movement sensor senses the movement status of the parking space sensor, generates the movement sensing signal, and transmits the movement sensing signal to the control unit. When the control unit judges that the parking space sensor is flipped over according to the movement sensing signal, the control unit performs the initialization procedure.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
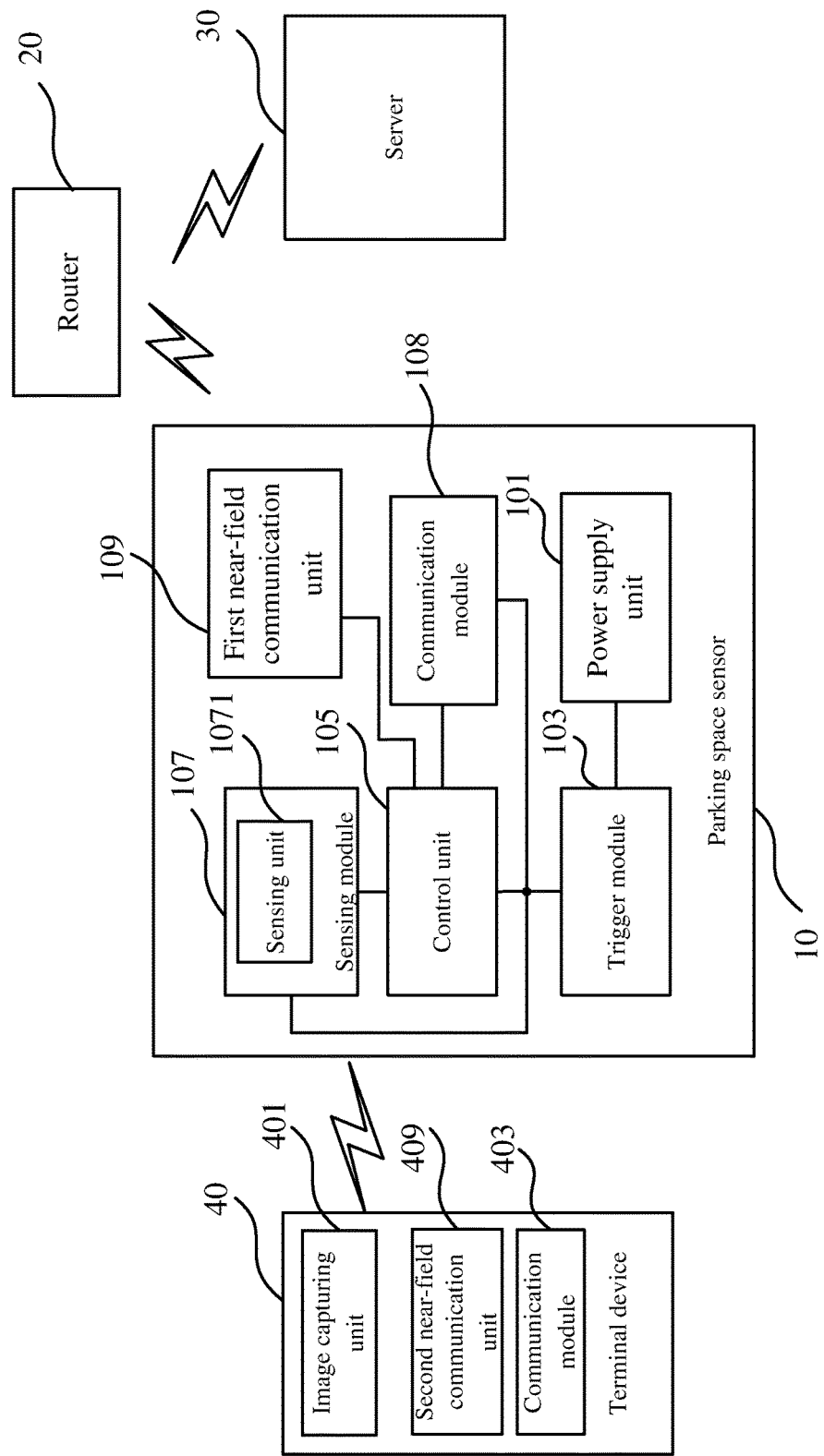
FIG. 1 shows a block diagram of the parking space sensor and the system thereof according to an embodiment of the present invention.

Please refer to FIG. 1, which shows a block diagram of the parking space sensor and the system thereof according to an embodiment of the present invention. As shown in the figure, the system of the parking space sensor 10 according to the present invention comprises a router 20 and a server 30. The parking space sensor 10 is disposed at a parking space for cars for sensing the status of the parking space and judging if the parking space is void. According to current parking space status, a piece of parking space information is produced. The parking space sensor 10 transmits the parking space information to the server 30 via the router 20. The server 30 acquires the current parking space status according to the parking space information. Then whether the parking space is void or not will be known. The driver connects to the server 30 using an electronic device having networking functions, such as mobile phones, tablet computers, personal digital assistants (PDAs), or car computers. Thereby, the driver can know the status of the parking spaces nearby and void parking spaces can be searched rapidly.

The above parking space sensor 10 comprises a power supply unit 101, a trigger module 103, a control unit 105, a sensing module 107, and a communication module 108. The power supply unit 101 is coupled to the trigger module 103. The trigger module 103 is coupled to the control unit 105, the sensing module 107, and the communication module 108. The control unit 105 is coupled to the sensing module 107 and the communication module 108. The sensing module 107 senses the status of the parking space and generates a corresponding sensing signal. According to an embodiment of the present invention, the sensing module 107 includes a sensing unit 1071, which is used for sensing the status of the parking space and generating the corresponding sensing signal. According to an embodiment of the present invention, the power supply unit 101, the trigger module 103, the control unit 105, the sensing module 107, and the communication module 108 are disposed in a housing (not shown in the figure) for being installed to the parking space with ease.

The control unit 105 performs an initialization procedure and transmits an initialization signal to the sensing module 107 for initializing the sensing module 107 and driving the sensing module 107 to sense the status of the parking space. In addition, the control unit 105 receives the sensing signal generated by the sensing module 107, produces the parking space information according to the sensing signal, and transmits the parking space information to the communication module 108. The communication module 108 transmits the parking space information to the server 30 via the router 20. The trigger module 103 is used for triggering the control unit 105 to perform the initialization procedure.

According to an embodiment of the present invention, the trigger module 103 can be a ball switch. As shown in FIG. 1, the trigger module 103 is coupled between the power supply unit 101 and the control unit 105. When the parking space sensor 10 is flipped over, the trigger module 103 will be flipped over as well. For example, the parking space sensor 10 is flipped over such that the top surface of the housing (not shown in the figure) of the parking space sensor 10 faces up. Then the ball switch is flipped over and turned on. Thereby, the power supply unit 101 can supply power to the control unit 105 via the ball switch, triggering the control unit 105 to perform the initialization procedure and initialize the sensing module 107. In addition, the power supply unit 101 also supplies power to the sensing module 107 and the communication module 108 via the ball switch.

According to an embodiment of the present invention, when an engineering staff flips the parking space sensor 10 and install it at a parking space, the trigger module 103 is flipped over. Then the trigger module 103 will trigger the control unit 105 to perform the initialization procedure for initializing the sensing module 107 and driving the sensing module 107 to sense the status of the parking space. For example, an engineering staff first digs an installation hole on the ground. Then he flips the parking space sensor 10 to make the top surface of the housing (not shown in the Figure) of the parking space sensor 10 face up. It means that the trigger module 103 triggers the control unit 105 to perform the initialization procedure. At last, the parking space sensor 10 is installed to the installation hole and thus completing installing the parking space sensor 10. The above installation method is only an embodiment of the present invention. The parking space sensor 10 is not limited to being installed in an installation hole only.

Figure 2:
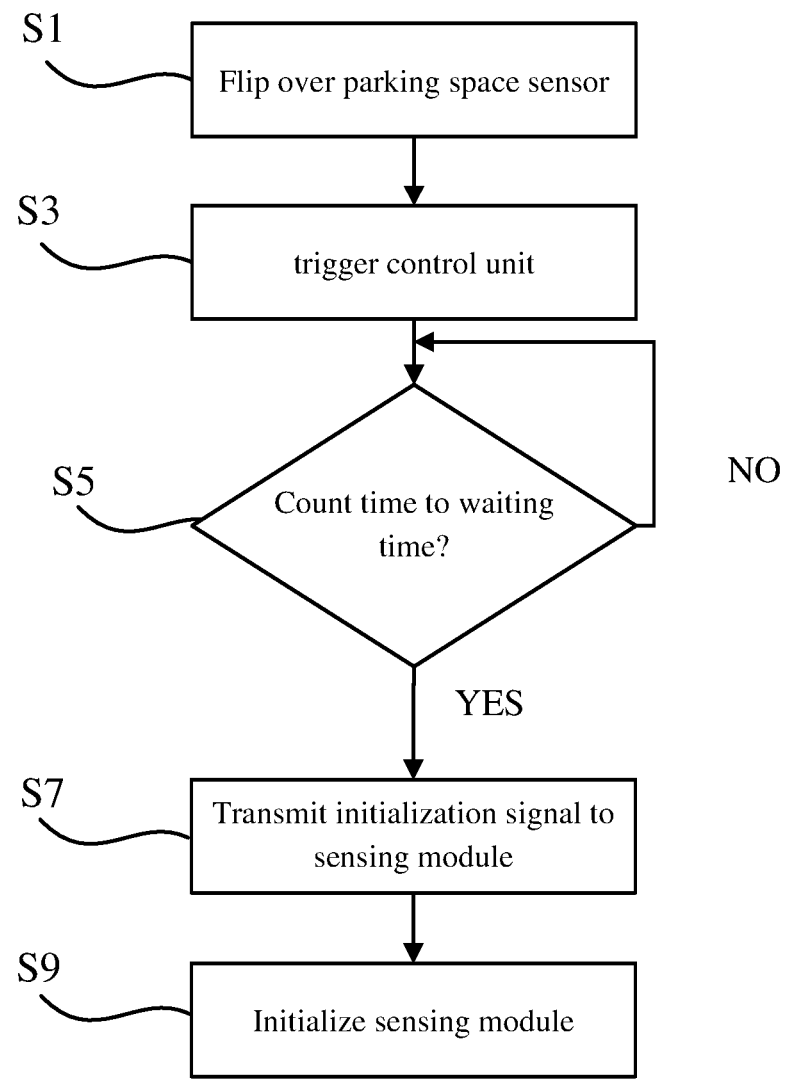
FIG. 2 shows a flowchart for operating the parking space sensor according to the first embodiment of the present invention.

Next, the operations of the parking space sensor according to the present invention will be described. Please refer to FIG. 2, which shows a flowchart for operating the parking space sensor according to the first embodiment of the present invention. As shown in the figure, before the parking space sensor according to the present embodiment operates, as shown in the step S1, the engineering staff will flip the parking space sensor 10 over, which means that the trigger module 103 will be flipped over accordingly. Thereby, as shown in the step S3, the trigger module 103 triggers the control unit 105 and driving the control unit 105 to perform the initialization procedure. As shown in the step S5, the control unit 105 counts the time. As the control unit 105 counts to a waiting time, it performs the step S7 for transmitting the initialization signal to the sensing module 107. Then, as shown in the step S9, the control unit 105 initializes the sensing module 107 for driving the sensing module 107 to sense the status of the parking space. In the step S5, before the control unit 105 counts to the waiting time, it continues to count the time and continues to repeat the step S5.

The waiting time described above can be preset in the control unit 105. The value of the waiting time can be set according to users' requirements. For example, the value of the waiting time can be time required for the engineering staff to flip the parking space sensor 10 over and complete installing the parking space sensor 10 at the parking space. Alternatively, in production lines, inspectors need to test the parking space sensors 10 by initializing the sensing modules 107. In this case, the waiting time can be set short. According to an embodiment of the present invention, two waiting times can be set in the control unit 105 and the first waiting time is shorter than the second one. In production lines, the control unit 105 performs the first initialization procedure according to the first waiting time. Afterwards, while installing the parking space sensor 10, the control unit 105 performs the second initialization procedure according to the second waiting time.

Figure 3B:
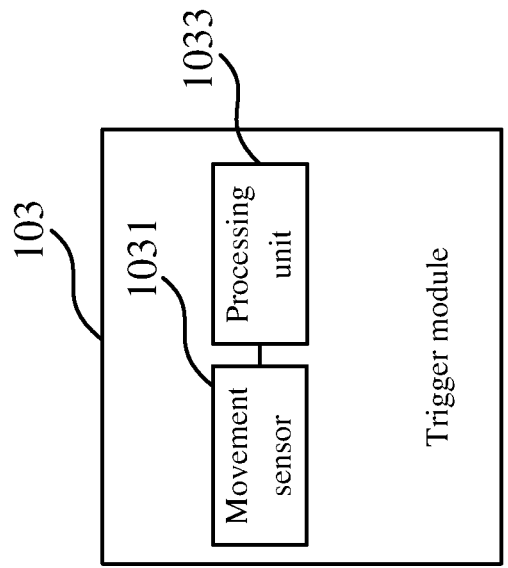
FIG. 3B shows a block diagram of the trigger module according to another embodiment of the present invention.
Figure 3A:
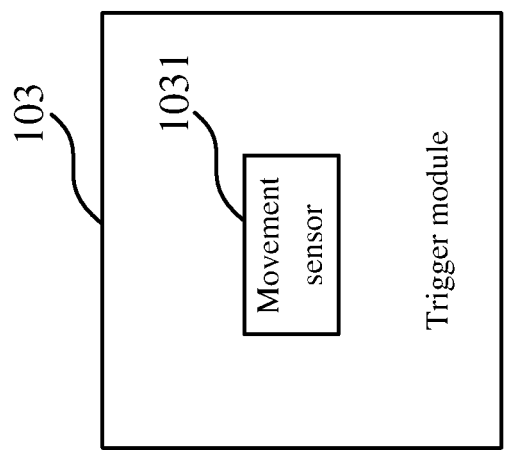
FIG. 3A shows a block diagram of the trigger module according to an embodiment of the present invention.

According to an embodiment of the present invention, as shown in FIG. 3A, the trigger module 103 can include a movement sensor 1031 coupled to the control unit 105. The movement sensor 1031 senses the movement status of the parking space sensor 10 and generates a movement sensing signal. The movement sensor 1031 transmits the movement sensing signal to the control unit 105. The control unit 105 performs the initialization procedure when judging that the parking space sensor 10 is flipped over according to the movement sensing signal. That is, when the parking space sensor 10 is flipped over, the control unit 105 will be triggered to perform the initialization procedure. The movement sensor 1031 can be gravity sensor, an accelerometer, a gyroscope, or other sensors capable of sensing the movement status of objects. According to the present embodiment, the power supply unit 101 can be coupled to the control unit 105, the sensing module 107, and the communication module 108 directly. The power supply unit 101 can supply power to the control unit 105, the sensing module 107, and the communication module 108 without passing the trigger module 103.

According to an embodiment of the present invention, as shown in FIG. 3B, the trigger module 103 can include a movement sensor 1031 and a processing unit 1033. The processing unit 1033 is coupled to the movement sensor 1031 and the control unit 105. The movement sensor 1031 senses the movement status of the parking space sensor 10 and generates a movement sensing signal. When the processing unit 1033 judges that the parking space sensor 10 is flipped over according to the movement sensing signal, the processing unit 1033 transmits a trigger signal to the control unit 105 for triggering the control unit 105 to perform the initialization procedure. According to the present embodiment, the power supply unit 101 can supply power to the control unit 105, the sensing module 107, and the communication module 108 without passing the trigger module 103.

Please refer again to FIG. 1. The sensing unit 1071 of the sensing module 107 according to the present invention can be a magnetic-field sensor capable of sensing the magnetic field, for example, the terrestrial magnetic field, of a parking space. Because cars can influence the intensity of magnetic field, the intensity of magnetic field will be changed if a car is parked in the parking space. Thereby, the control unit 105 can judge if the parking space is occupied according to the variation of the magnetic field in the parking space. In the following, the method for sensing the status of a parking space by the parking space sensor 10 will be described using FIG. 4.

Figure 4:
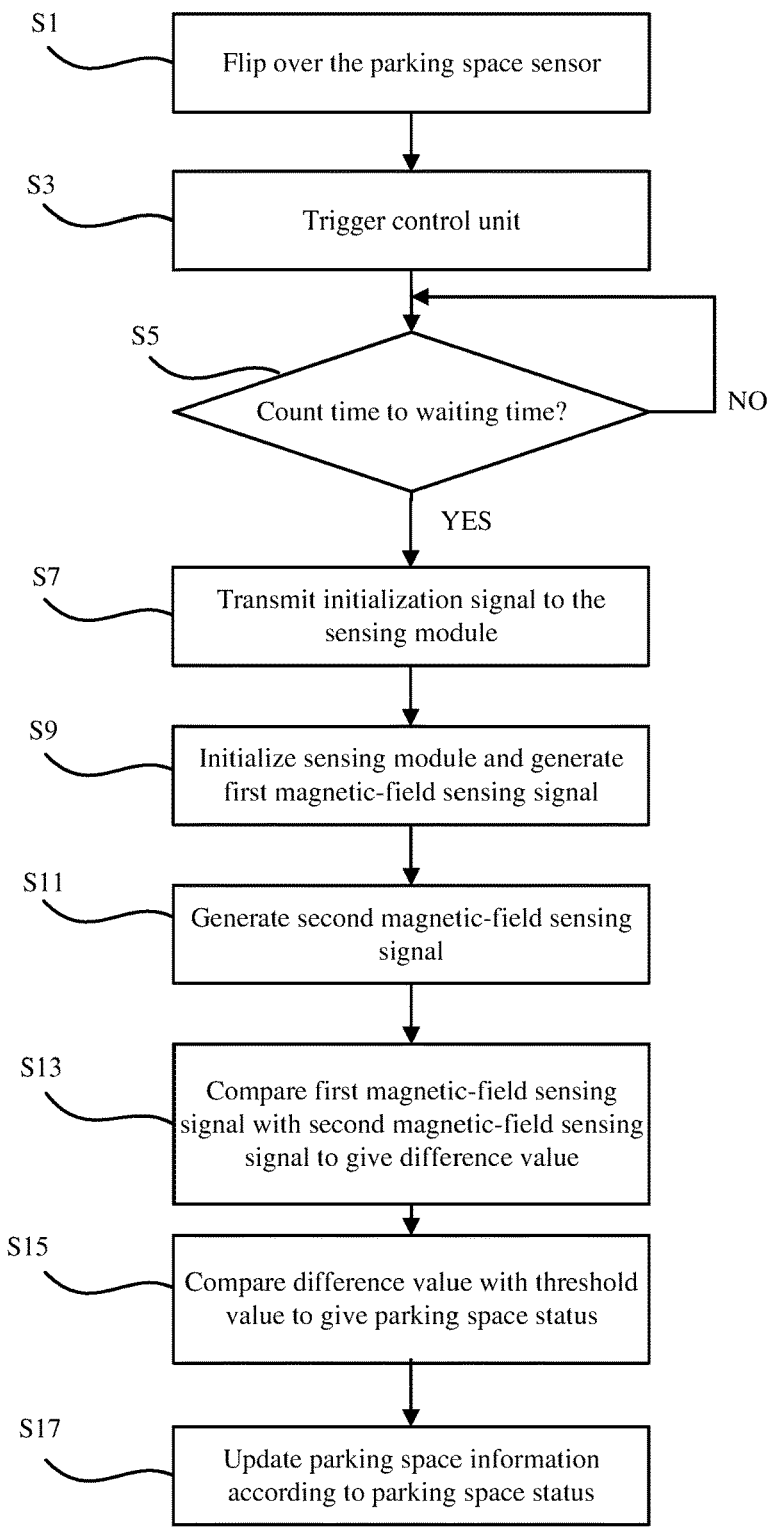
FIG. 4 shows a flowchart for operating the parking space sensor according to the second embodiment of the present invention.

Please refer to FIG. 4, which shows a flowchart for operating the parking space sensor according to the second embodiment of the present invention. As shown in the steps S1 to S9, when the engineering staff flips the parking space sensor 10 over, the trigger module 103 triggers the control unit 105 to perform the initialization procedure. When the control unit 105 counts the time to the waiting time, it transmits the initialization signal to the sensing module 107 and initializes the sensing module 107. When the sensing module 107 receives the initialization signal, it senses the magnetic-field status of the parking space and generates the sensing signal corresponding to the intensity of the magnetic field. According to the present embodiment, the sensing signal generated by the sensing module 107 in the initialization stage is the first magnetic-field sensing signal, which is then stored. According to the present embodiment, while installing the parking space sensor 10 to a parking space, there is no car parked in the parking space. Thereby, the first magnetic-field sensing signal represents the magnetic-field intensity of the parking space without a car. Besides, the parking information transmitted by the parking space sensor 10 to the server 30 via the router 20 represents that the parking space is void.

After the sensing module 107 senses the magnetic field of the parking space in the initial status, the step S11 is next performed. The sensing module 107 senses the magnetic field of the parking space subsequently and generates the sensing signal corresponding to the magnetic-field intensity. According to the present embodiment, the sensing signal generated by the sensing module 107 after the initialization stage is the second magnetic-field sensing signal. Accordingly, the sensing module 107 continues to sense the magnetic field of the parking space for monitoring variation in the magnetic field. Consequently, whether the parking space status is changed can be known. Namely, whether the parking space is void or not will be known. As shown in the step S13, compare the first and second magnetic-field sensing signals to give the difference value therebetween. According to an embodiment of the present invention, the control unit 105 receives the first and second magnetic-field sensing signals and compares them to give the difference value.

Next, as shown in the step S15, compare the difference value with a threshold value to produce a comparison result and produce the parking space information by judging the current parking space status according to the comparison result. To elaborate, when the difference value exceeds the threshold value, it means that the parking space status is changed. According to an embodiment of the present invention, initially, the parking space is void. Now, the change in the magnetic-field intensity of the parking space is significant, meaning that a car is parked in the parking space. Thereby, it is judged that the current parking space status is occupied. When the difference value does not exceed the threshold value, it means that the parking space is void. Thereby, it is judged that the current parking space status is void. According to an embodiment of the present invention, the control unit 105 compares the difference value with the threshold value to give the comparison result, and judges the current parking space status according to the comparison result.

After the current parking space status is known, the step S17 is performed for updating the parking space information according to the parking space status. The control unit 105 updates the parking space information according to the parking space status and transmits the updated parking space information via the communication module 108. The updated parking space information is transmitted to the server 30 via the router 20. According to the above description, it is known that the control unit 105 updates the parking space information according to the first magnetic-field sensing signal and the second magnetic-field sensing signal. According to an embodiment of the present invention, the parking space information includes a piece of status information, which represents the current parking space status, namely, whether a car is parked in the parking space or not. The above updating the parking space information is to update the status information.

Because the magnetic field of the parking space will be influenced when a car or another object approaches or passes by the parking space, the accuracy of judging the parking space status by the parking space sensor 10 might be influenced. Thereby, according to an embodiment of the present invention, in the step S15, when the difference value exceeds the threshold value, it can be further judged if the condition of the difference value exceeding the threshold value lasts for a sustained time. If not, it means that the current parking space status is identical to the initial parking space status. According to the present embodiment, it means the parking space is void. Thereby, when a car or another object approaches or passes by the parking space, false judgements by the parking space sensor 10 on the current status different from the initial status can be avoided.

According to the above description, if the difference value exceeds the threshold value and lasts for the sustained time, it means that the current parking space status is different from the initial parking space status. According to the present embodiment, when the difference value is greater than the threshold value and lasts for the sustained time, the control unit 105 produces the comparison result, judges that a car is parked in the parking space, and updates the status information in the parking space information. If the difference value does not exceed the threshold value or the difference value exceeds the threshold value but does not last to the sustained time, the control unit 105 judges that the parking space is void. According to an embodiment of the present invention, the sustained time is to preset in the control unit 105 of the parking space sensor 10.

Figure 5:
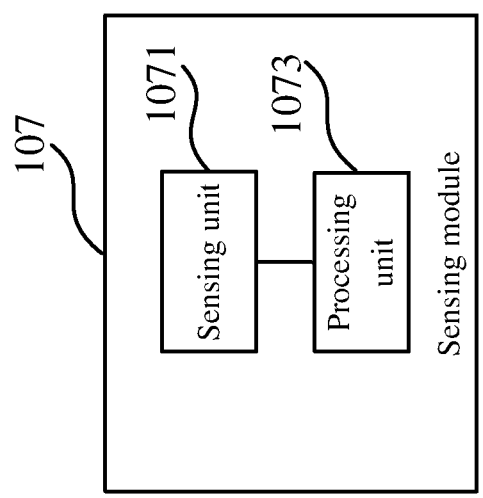
FIG. 5 shows a block diagram of the sensing module according to another embodiment of the present invention.

According to an embodiment of the present invention, as shown in FIG. 5, the sensing module 107 can include the sensing unit 1071 and a processing unit 1073. The sensing unit 1071 is coupled to the processing unit 1073. The processing unit 1073 compares the first and second magnetic-field sensing signals generated by the sensing unit 1071 to give the difference value. It also compares the difference value with the threshold value to give the comparison result. Then, according to the comparison result, the processing unit 1073 judges the current parking space status; according to the current parking space status, it transmits a status signal to the control unit 105. The control unit 105 updates the status information in the parking space information according to the status signal. According to another embodiment of the present invention, the processing unit 1073 compares the difference value with the threshold value. When the former exceeds the latter, it further judges if the condition of the difference value greater than the threshold value lasts for the sustained time. The sustained time can be preset in the processing unit 1073. If the difference value is greater than the threshold value and lasts for the sustained time, the processing unit 1073 produces the comparison result and judges that the current parking space status is different from the initial parking space status. According to the present embodiment, a car is already parked in the parking space. The processing unit 1073 transmits the status signal to the control unit 105. The control unit 105 updates the status information in the parking space information according to the status signal.

According to an embodiment of the present invention, each parking space sensor 10 includes a piece of identification information distinct from the identification information of the other parking space sensors 10 for identifying the identification of the parking space sensor 10. In addition, the location of the parking space for each parking space sensor 10 corresponds to a piece of location information. According to the above description, each parking space sensor 10 includes the identification information and the location information. The server 30 stores the identification information and the location information of each parking space sensor 10. In other words, the server 30 records the location of each parking space sensor 10. Besides, in addition to the status information, the parking space information transmitted by the parking space sensor 10 to the server 30 further includes the identification information of the parking space sensor 10. Thereby, the server 30 can know the location information of the parking space sensor 10 corresponding to the identification information, and updates the parking space status corresponding to the location information according to the status information in the parking space information. Hence, drivers can inquire the current statuses of all parking spaces conveniently.

According to the above description, the parking space sensor 10 can judge the parking space status according to the sensing signals generated by the sensing module 107, update the parking space information according to the parking space status, and transmit the updated parking space information to the server 30. Thereby, the server 30 can update the status of the parking space where the parking space sensor 10 is located. People can inquire the statuses of all parking spaces by simply connecting to the server 30 using electronic device having networking functions. Accordingly, the void parking spaces can be found conveniently.

Please refer again to FIG. 1. The system of the parking space sensor 10 according to the present invention can further comprise a terminal device 40, which can include an image capturing unit 401, a communication module 403, and a second near-field communication unit 409. The parking space sensor 10 can further comprise a first near-field communication unit 109. According to an embodiment of the present invention, the engineering staff can use the terminal device 40 to initialize the parking space sensor 10. The terminal device 40 can capture an electronic barcode disposed on the parking space sensor 10 using the image capturing unit 401 for acquiring the identification information of the parking space sensor 10. According to an embodiment of the present invention, the terminal device 40 can use the second near-field communication unit 409 to communicate with the first near-field communication unit 109 of the parking space sensor 10 and acquire the identification information of the parking space sensor 10.

The communication module 403 of the terminal device 40 can transmit an initialization command to the parking space sensor 10. The communication module 108 of the parking space sensor 10 receives the initialization command and transmits the initialization command to the control unit 105. The control unit 105 transmits the initialization signal to the sensing module 107 according to the initialization command for initializing the sensing module 107. The sensing module 107 senses the initial parking space status according to the initialization signal.

Figure 6:
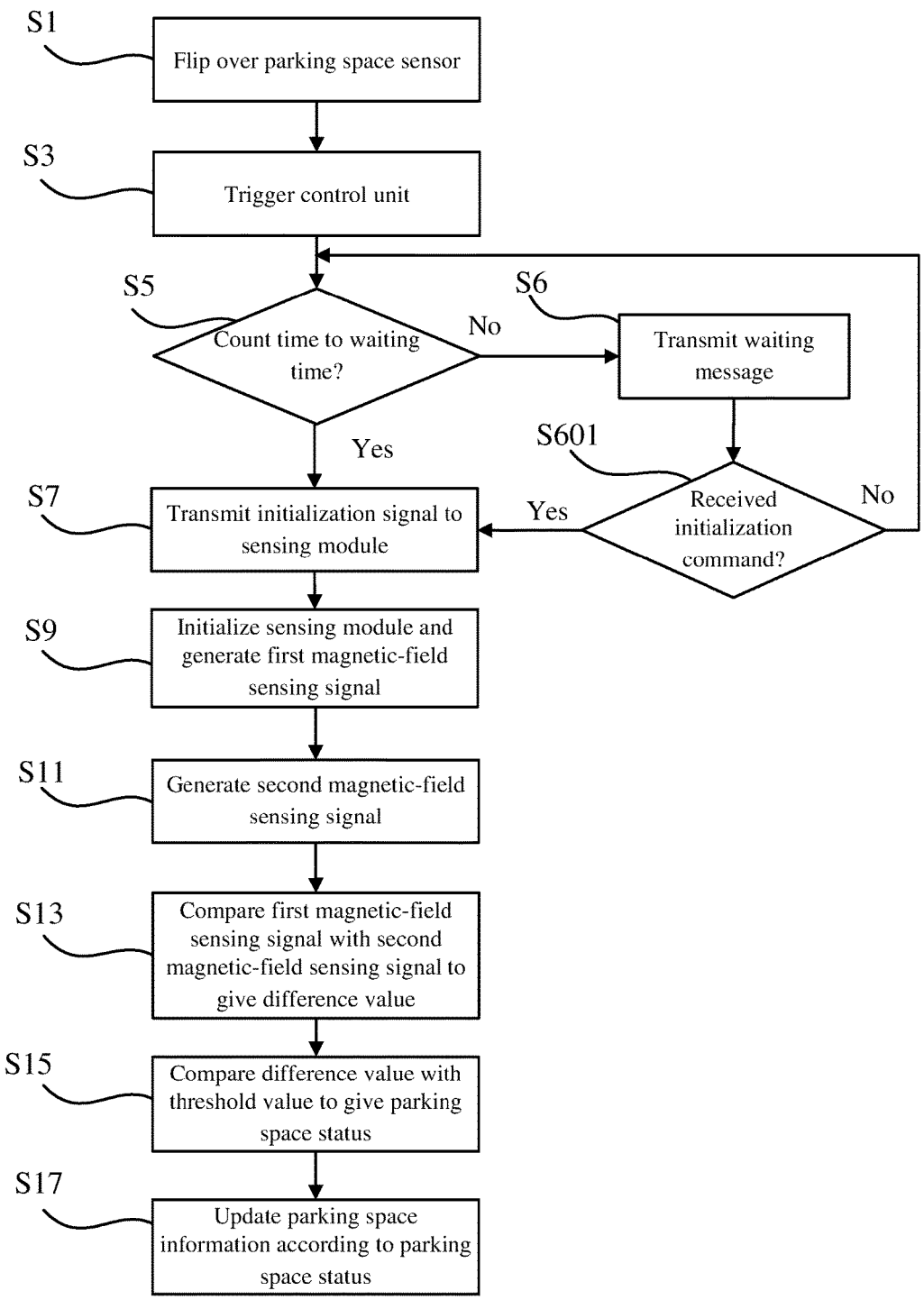
FIG. 6 shows a flowchart for operating the parking space sensor according to the third embodiment of the present invention.

Please refer to FIG. 6, which shows a flowchart for operating the parking space sensor according to the third embodiment of the present invention. As shown in the figure, as shown in the steps S1 to S5, when the engineering staff flips the parking space sensor 10, the trigger module 103 will trigger the control unit 105 and hence drive the control unit 105 to perform the initialization procedure. The control unit 105 starts to count the time. When the counting time of the control unit 105 has not reached the waiting time, the control unit 105 performs the step S6.

As shown in the step S6, the control unit 105 transmits a waiting message to the communication module 108. The communication module 108 transmits the waiting message to the terminal device 40. The waiting message includes the identification information of the parking space sensor 10. The terminal device 40 receives the waiting message, and identifies the parking space sensor 10 according to the identification information of the waiting message. Thereby, the engineering staff can know which parking space sensors 10 are not initialized yet via the terminal device 40. The engineering staff can operate the terminal device 40, and transmits the initialization command to the parking space sensor 10 via the communication module 403. According an embodiment of the present invention, when counting time by the control unit 105 has not reached the waiting time, the control unit 105 transmits the waiting message to the terminal device 40 via the communication module 108 for every fixed time.

After the control unit 105 transmits the waiting message to the terminal device 40 via the communication module 108, the control unit 105 performs the step S601 for judging if the initialization command of the terminal device 40 is received. If so, the step S7 is executed, in which the control unit 105 transmits the initialization signal to the sensing module 107 for initializing the sensing module 107. If not, continue to execute the step S5. If the control unit 105 has not received the initialization command of the terminal device 40 all the time and the counting time has reached the waiting time, then the control unit 105 executes the step S7 for transmitting the initialization signal to the sensing module 107. The steps S9 to S17 according to the present embodiment are identical to the steps S9 to S17 according to the embodiment in FIG. 4. Hence, the details will not be described again.

According to the above description, the parking space sensor 10 can transmit the waiting message to the terminal device 40 before counting to the waiting time. When the terminal device 40 receives the waiting message, it can transmit the initialization command to the parking space sensor 10 according to the waiting message and thus drive the parking space sensor 10 to initialize. According to the present embodiment, the engineering staff can leave the parking place after the installation of the parking space sensor 10 is finished. Then, the terminal device 40 is used to transmit the initialization command to the parking space sensor 10 for driving the parking space sensor 10 to perform initialization.

As shown in FIG. 4, in the step S15, when the difference value is greater than the threshold value, it is further judged if the condition lasts for the sustained time. If so, it is judged that the current parking space status is different from the initial status. According to the present embodiment, it means that the parking space is occupied. If the difference value is not greater than the threshold value or the difference value is greater than the threshold value but not lasts for the sustained time, it is judged that the current parking space status is identical to the initial status. According to the present embodiment, it means that the parking space is void. According an embodiment of the present invention, the terminal device 40 can transmit a piece of configuration information to the parking space sensor 10 for configuring the sustained time. For example, the initialization command includes the configuration information.

To sum up, the parking space sensor according to the present invention can sense the parking space status and provide the parking space information for facilitating people searching void parking spaces. In addition, the engineering staff can simply flip the parking space sensor over for driving the control unit in the parking space sensor to perform the initialization procedure and thus initializing the sensing module of the parking space sensor.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

What is claimed is:
1. A parking space sensor, comprising:
   a sensing module, sensing a parking space status of a parking space, and generating a sensing signal;
   a control unit, coupled to said sensing module, performing an initialization procedure by transmitting an initialization signal to said sensing module for initializing said sensing module for sensing said parking space status, receiving said sensing signal, and generating a piece of parking space information according to said sensing signal; and a trigger module, coupled to said control unit, and triggering said control unit to perform said initialization procedure when said trigger module is flipped over;

a communication module, transmitting a waiting message having a piece of identification information; said control unit counting the time when said control unit is triggered by said trigger module to perform said initialization procedure; said control unit controlling said communication module to transmit said waiting message before said control unit counts the time to a waiting time; a terminal device receiving said waiting message and identifying said parking space sensor according to said identification information of said waiting message; said terminal device transmitting an initialization command; said communication module receiving said initialization command and transmitting said initialization command to said control unit; and said control unit transmitting said initialization signal to said sensing module according to said initialization command.

2. The parking space sensor of claim 1, wherein said terminal device includes an image capturing unit for capturing an electronic barcode disposed on said parking space sensor and acquiring said identification information of said parking space sensor.

3. The parking space sensor of claim 1, further comprising a first near-field communication unit; said terminal device including a second near-field communication unit; and said second near-field communication unit communicating with said first near-field communication unit for acquiring said identification information of said parking space sensor.

4. The parking space sensor of claim 1, and further comprising a power supply unit; said trigger module including a ball switch coupled between said power supply unit and said control unit; and when said trigger module is flipped over and said ball switch is turned on, said power supply unit supplying power to said control unit via said ball switch for triggering said control unit to perform said initialization procedure.

5. The parking space sensor of claim 1, wherein said trigger module includes a movement sensor for sensing the movement status of said parking space sensor; and when said parking space sensor is flipped over, said control unit is triggered to perform said initialization procedure.

6. The parking space sensor of claim 5, wherein said trigger module further includes a processing unit coupled to said movement sensor and said control unit; said movement sensor senses the movement status of said parking space sensor and generates a movement sensing signal; and when said processing unit judges that said parking space sensor is flipped over according to said movement sensing signal, said processing unit triggers said control unit to perform said initialization procedure.

7. The parking space sensor of claim 5, wherein said movement sensor senses the movement status of said parking space sensor, generates a movement sensing signal, and transmits said movement sensing signal to said control unit; and when said control unit judges that said parking space sensor is flipped over according to said movement sensing signal, said control unit performs said initialization procedure.

8. A parking space sensor, comprising:

a sensing module, sensing a parking space status of a parking space, and generating a sensing signal;

a control unit, coupled to said sensing module, performing an initialization procedure by transmitting an initialization signal to said sensing module for initializing said sensing module for sensing said parking space status, receiving said sensing signal, and generating a piece of parking space information according to said sensing signal; and a trigger module, coupled to said control unit, and triggering said control unit to perform said initialization procedure when said trigger module is flipped over;

wherein when said control unit is triggered by said trigger module to perform said initialization procedure, said control unit counts the time; and when said control unit counts the time to a waiting time, said control unit transmits said initialization signal to said sensing module.

9. A parking space sensor, comprising:

a sensing module, sensing a parking space status of a parking space, and generating a sensing signal;

a control unit, coupled to said sensing module, performing an initialization procedure by transmitting an initialization signal to said sensing module for initializing said sensing module for sensing said parking space status, receiving said sensing signal, and generating a piece of parking space information according to said sensing signal; and a trigger module, coupled to said control unit, and triggering said control unit to perform said initialization procedure when said trigger module is flipped over;

wherein said sensing signal includes a first magnetic-field sensing signal and a second magnetic-field sensing signal; when said sensing module receives said initialization signal, said sensing module senses the magnetic field of said parking space, generates said first magnetic-field sensing signal, and saves said first magnetic-field sensing signal; said sensing module continues to sense the magnetic field of said parking space and generates said second magnetic-field sensing signal; said control unit updates said parking space information according to a difference value between said first magnetic-field sensing signal and said second magnetic-field sensing signal and transmits said updated parking space information to a server; said updated parking space information includes a piece of identification information and a piece of status information; and said server acquires a piece of location information of said parking space sensor according to said identification information.

10. The parking space sensor of claim 9, wherein said sensing module includes a sensing unit and a processing unit; said sensing unit senses the magnetic field of said parking space; said processing unit compares said first magnetic-field sensing signal with said second magnetic-field sensing signal to give said difference value; said processing unit compares said difference value with a threshold value to produce a comparison result for judging said parking space status and transmits a status signal to said control unit; and said control unit updates said status information of said parking space information according to said status signal.

11. The parking space sensor of claim 10, wherein when said difference value is greater than said threshold value and lasts for a sustained time, said processing unit produces said comparison result, judges that a car parks in said parking space, and transmits said status signal to said control unit.

12. The parking space sensor of claim 11, wherein a terminal device transmits a piece of configuration information to said parking space sensor for configuring said sustained time.

13. The parking space sensor of claim 9, wherein said control unit compares said first magnetic-field sensing signal with said second magnetic-field sensing signal to give said difference value; and said control unit compares said difference value with a threshold value to produce a comparison result, and updates said status information of said parking space information according to said comparison result.

14. The parking space sensor of claim 13, wherein when said difference value is greater than said threshold value and lasting for a sustained time, said control unit produces said comparison result, judges that a car parks in said parking space, and updates said status information of said parking space information.

15. The parking space sensor of claim 14, wherein a terminal device transmits a piece of configuration information to said parking space sensor for configuring said sustained time.

* * * * *